(12) United States Patent
An et al.

(10) Patent No.: US 11,125,810 B2
(45) Date of Patent: Sep. 21, 2021

(54) BLIND-MATE PIM TESTING ADAPTER CONNECTOR AND FIXTURE

(71) Applicant: CommScope Technologies LLC, Hickory, NC (US)

(72) Inventors: Hongjuan An, Suzhou (CN); Yujun Zhang, Suzhou (CN); Jin Liu, Suzhou (CN); Jien Zheng, Suzhou (CN); JianPing Wu, Suzhou (CN)

(73) Assignee: CommScope Technologies LLC, Hickory, NC (US)

( * ) Notice: Subject to any disclaimer, the term of this patent is extended or adjusted under 35 U.S.C. 154(b) by 390 days.

(21) Appl. No.: 16/236,992

(22) Filed: Dec. 31, 2018

(65) Prior Publication Data
US 2019/0219631 A1 Jul. 18, 2019

(30) Foreign Application Priority Data
Jan. 12, 2018 (CN) .......................... 201810028514.6

(51) Int. Cl.
*G01R 31/28* (2006.01)
*H01R 24/40* (2011.01)
(Continued)

(52) U.S. Cl.
CPC ..... *G01R 31/2844* (2013.01); *H01R 13/6583* (2013.01); *H01R 24/40* (2013.01); *H01R 2103/00* (2013.01)

(58) Field of Classification Search
CPC .................. G01R 31/2844; G01R 31/2822; G01R 31/58; H01R 9/05; H01R 9/0503;
(Continued)

(56) References Cited

U.S. PATENT DOCUMENTS 7,914,311 B1 * 3/2011 Gallusser ............. H01R 13/622
439/321
8,628,352 B2 1/2014 Nugent
(Continued)

FOREIGN PATENT DOCUMENTS

EP 2605338 1/2018

OTHER PUBLICATIONS

International Preliminary Report on Patentability corresponding to International Application No. PCT/US2019/012035 dated Jul. 23, 2020.
(Continued)

*Primary Examiner* — Giovanni Astacio-Oquendo
*Assistant Examiner* — Dustin R Dickinson
(74) *Attorney, Agent, or Firm* — Myers Bigel, P.A.

(57) ABSTRACT

A fixture for testing coaxial connectors for PIM includes: (a) an adapter connector comprising an inner contact; an outer body that circumferentially surrounds and that is spaced from the inner contact, the outer body including an inner ring and an outer ring with a gap therebetween; and a resilient member in electrical contact with the outer body; and (b) a foundation including a fixed sleeve and a biasing member, the biasing member exerting an axial force on the sleeve and the outer body, the biasing member permitting axial and radial adjustment of the outer body and inner contact relative to the sleeve. The gap between the inner and outer rings of the outer body is configured to receive an outer ring of an outer body of a coaxial connector to be tested. The inner ring of the test fixture is located to be radially outward of an inner ring of the outer body of the coaxial connector to be tested. The resilient member is positioned to apply radial pressure to the inner ring of the outer body of coaxial connector to be tested.

18 Claims, 6 Drawing Sheets

(51) Int. Cl.
*H01R 13/6583* (2011.01)
*H01R 103/00* (2006.01)

(58) Field of Classification Search
CPC .. H01R 9/0527; H01R 9/0524; H01R 13/622; H01R 13/6582; H01R 13/6583; H01R 13/6584; H01R 24/40; H01R 24/542
See application file for complete search history.

(56) References Cited

U.S. PATENT DOCUMENTS

| | | | |
|---|---|---|---|
| 9,166,306 B2 | 10/2015 | Montena et al. | |
| 9,425,548 B2 | 8/2016 | Van Swearingen | |
| 2010/0297871 A1* | 11/2010 | Haube | H01R 13/641 439/489 |
| 2015/0200469 A1* | 7/2015 | Vaccaro | H01R 13/24 439/578 |
| 2016/0149320 A1* | 5/2016 | Anderson | H01B 7/29 174/84 R |
| 2017/0133772 A1* | 5/2017 | Paynter | H01R 9/0521 |
| 2017/0324197 A1 | 11/2017 | Grassl et al. | |

OTHER PUBLICATIONS

International Search Report and Written Opinion corresponding to International Application No. PCT/US2019/012035 dated Apr. 26, 2019.

* cited by examiner

US 11,125,810 B2

BLIND-MATE PIM TESTING ADAPTER CONNECTOR AND FIXTURE

FIELD OF THE INVENTION

The present application claims priority from and the benefit of Chinese Patent Application No. 201810028514.6, filed Jan. 12, 2018, the disclosure of which is hereby incorporated herein by reference in full.

FIELD OF THE INVENTION

The present invention is directed generally to electrical cable connectors, and more particularly to coaxial connectors for electrical cable.

BACKGROUND

Coaxial cables are commonly utilized in RF communications systems. A typical coaxial cable includes an inner conductor, an outer conductor, a dielectric layer that separates the inner and outer conductors, and a jacket that covers the outer conductor. Coaxial cable connectors may be applied to terminate coaxial cables, for example, in communication systems requiring a high level of precision and reliability.

Coaxial connector interfaces provide a connect/disconnect functionality between (a) a cable terminated with a connector bearing the desired connector interface and (b) a corresponding connector with a mating connector interface mounted on an electronic apparatus or on another cable. Typically, one connector will include a structure such as a pin or post connected to an inner conductor of the coaxial cable and an outer conductor connector body connected to the outer conductor of the coaxial cable; these connectors are mated with a mating sleeve (for the pin or post of the inner conductor) and another outer connector body of a second connector. Coaxial connector interfaces often utilize a threaded coupling nut or other retainer that draws the connector interface pair into secure electro-mechanical engagement when the coupling nut (which is captured by one of the connectors) is threaded onto the other connector.

Passive Intermodulation Distortion (PIM) is a form of electrical interference/signal transmission degradation that may occur with less than symmetrical interconnections and/or as electro-mechanical interconnections shift or degrade over time. Interconnections may shift due to mechanical stress, vibration, thermal cycling, and/or material degradation. PIM can be an important interconnection quality characteristic, as PIM generated by a single low quality interconnection may degrade the electrical performance of an entire RF system. Thus, the reduction of PIM via connector design is typically desirable.

PIM testing is conventionally carried out by attaching a coaxial cable and connector to a mating test fixture and assessing performance. An exemplary test fixture and connector under test are shown in FIG. 1. The fixture 110, shown on the left side of FIG. 1, includes an inner contact 112, an outer body 114 that circumferentially surrounds the inner contact 112, such that a gap 116 is present therebetween. A coupling nut 118 is positioned radially outwardly of the outer body 114 and is held in place by a shoulder 114a on the outer surface of the outer body 114. The inner contact 112 includes a frustoconical tip 112a and a shoulder 112b. The outer body 114 has a shoulder 114b on its inner surface. The connector 150, shown in the right side of FIG. 1 is a standard 7/16 DIN female connector having an inner contact 152 with spring fingers 152a and an outer body 154 that has an inner ring 154a and an outer ring 154b that circumferentially sandwich a gap 156. The outer body 154 also includes outer threads 154c.

The connector 150 is mounted on the fixture 110 such that the spring fingers 152a capture the tip 112a of the inner contact 112 of the fixture 110, and the inner and outer rings 154a, 154b of the outer body 154 capture the outer body 114. The inner ring 154a of the outer body 154 "bottoms out" against the shoulder 114b of the outer body 114 of the fixture 110. The connector 150 is secured into place by rotating the coupling nut 118 onto the threads 154c of the outer body 154. Once the connector 150 is secured to the fixture 110, PIM testing can occur on the connector 150 in a conventional manner.

The fixture 110 can give inconsistent results at times, as the torque level of the coupling nut 118 during/after mating can impact the generation of PIM. Also, coupling and decoupling the connector 150 to the fixture 110 via the coupling nut 118 can be time-consuming. Further, the magnitude of torque required to ensure reliable axial contact can be difficult to achieve in close quarters. Moreover, the fixture 110 cannot adjust to misaligned mating connectors and lacks rapid push-on/push-off functionality, and is typically unsuitable for modular and intensive field operations.

SUMMARY

As a first aspect, embodiments of the invention are directed to a fixture for testing coaxial connectors for PIM. The fixture comprises: (a) a adapter connector comprising an inner contact; an outer body that circumferentially surrounds and that is spaced from the inner contact, the outer body including an inner ring and an outer ring with a gap therebetween; and a resilient member in electrical contact with the outer body; and (b) a foundation including a fixed sleeve and a biasing member, the biasing member exerting an axial force on the sleeve and the outer body, the biasing member permitting axial and radial adjustment of the outer body and inner contact relative to the sleeve. The gap between the inner and outer rings of the outer body is configured to receive an outer ring of an outer body of a coaxial connector to be tested. The inner ring of the test fixture is located to be radially outward of an inner ring of the outer body of the coaxial connector to be tested. The resilient member is positioned to apply radial pressure to the inner ring of the outer body of coaxial connector to be tested.

Embodiments of the invention can provide quick push-on/pull-off functionality, with no torque wrench required for mating, which can save significant time during testing. In addition, the above-described fixture may be compatible with thread-coupling interfaces, such as a 7/16 DIN interface, may provide a certain tolerance range for mating, and may be suitable for multi-port installation and testing.

As a second aspect, embodiments of the invention are directed to methods of testing coaxial connectors for PIM, comprising the steps of providing a fixture as discussed above and testing a coaxial connector mated with the fixture for PIM.

DETAILED DESCRIPTION

The present invention is described with reference to the accompanying drawings, in which certain embodiments of the invention are shown. This invention may, however, be embodied in many different forms and should not be construed as limited to the embodiments that are pictured and described herein; rather, these embodiments are provided so that this disclosure will be thorough and complete, and will fully convey the scope of the invention to those skilled in the art. It will also be appreciated that the embodiments disclosed herein can be combined in any way and/or combination to provide many additional embodiments.

Unless otherwise defined, all technical and scientific terms that are used in this disclosure have the same meaning as commonly understood by one of ordinary skill in the art to which this invention belongs. The terminology used in the above description is for the purpose of describing particular embodiments only and is not intended to be limiting of the invention. As used in this disclosure, the singular forms "a", "an" and "the" are intended to include the plural forms as well, unless the context clearly indicates otherwise. It will also be understood that when an element (e.g., a device, circuit, etc.) is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
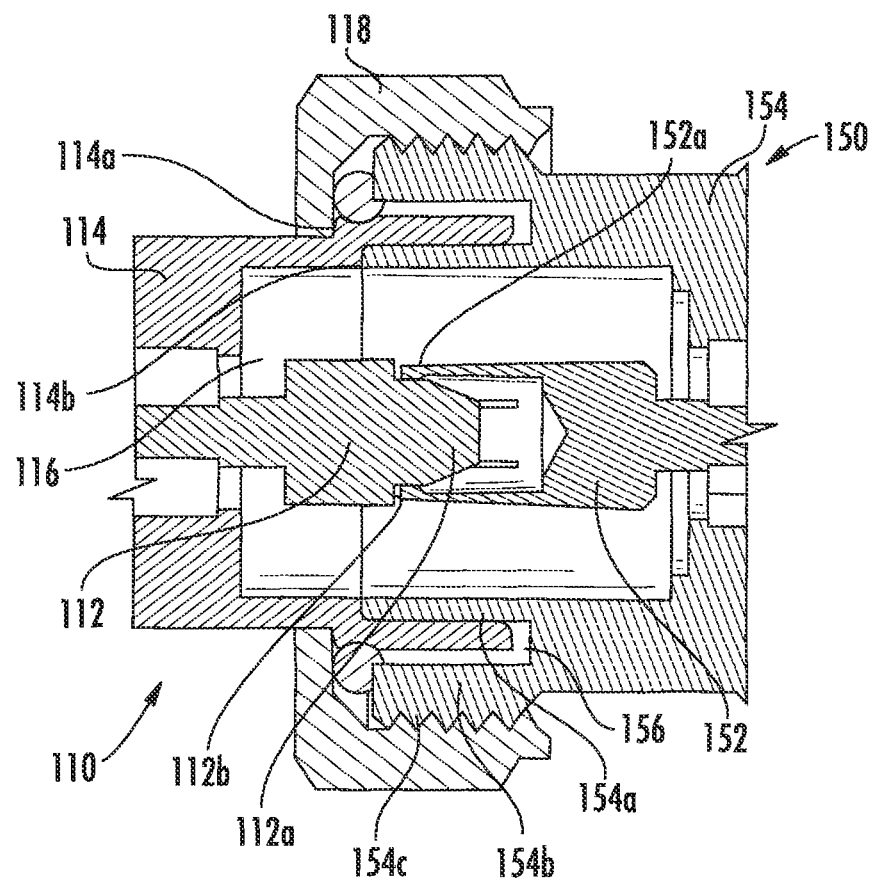
FIG. 1 is a section view of a prior PIM test fixture and mating DIN connector.
Figure 2:
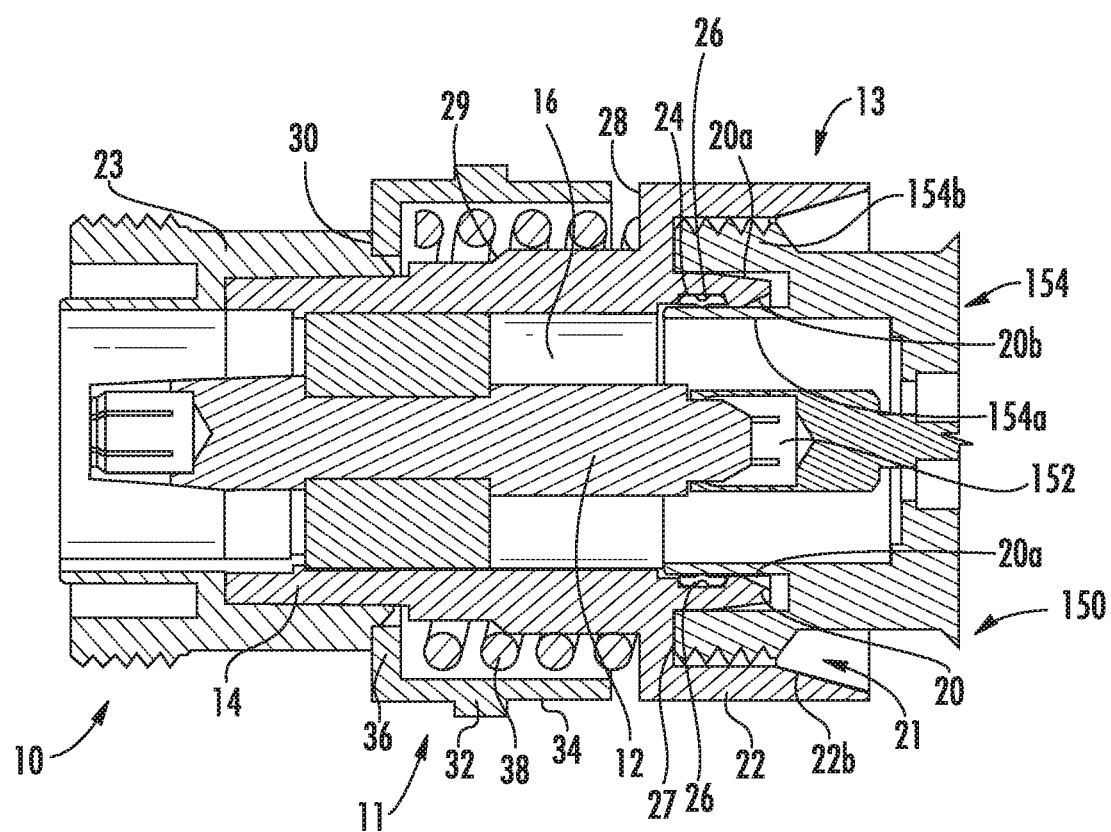
FIG. 2 is a section view of a PIM test fixture and mating DIN connector according to embodiments of the invention.
Figure 3:
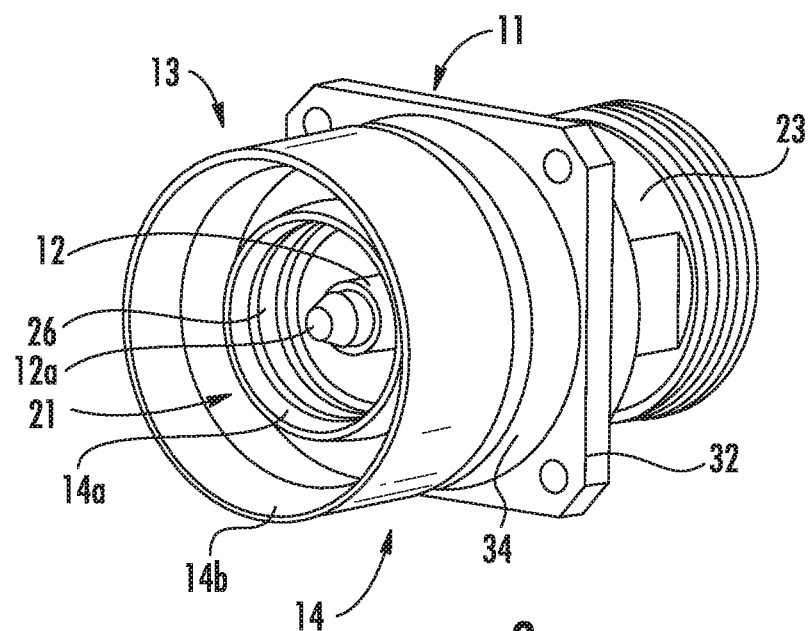
FIG. 3 is a perspective view of the adapter connector of the test fixture of FIG. 2.
Figure 4:
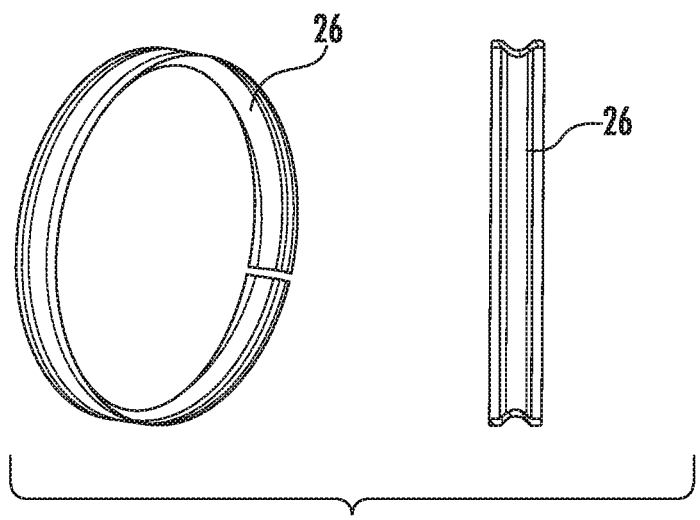
FIG. 4 is a perspective view of the spring ring of the adapter connector of FIG. 2
Figure 8:
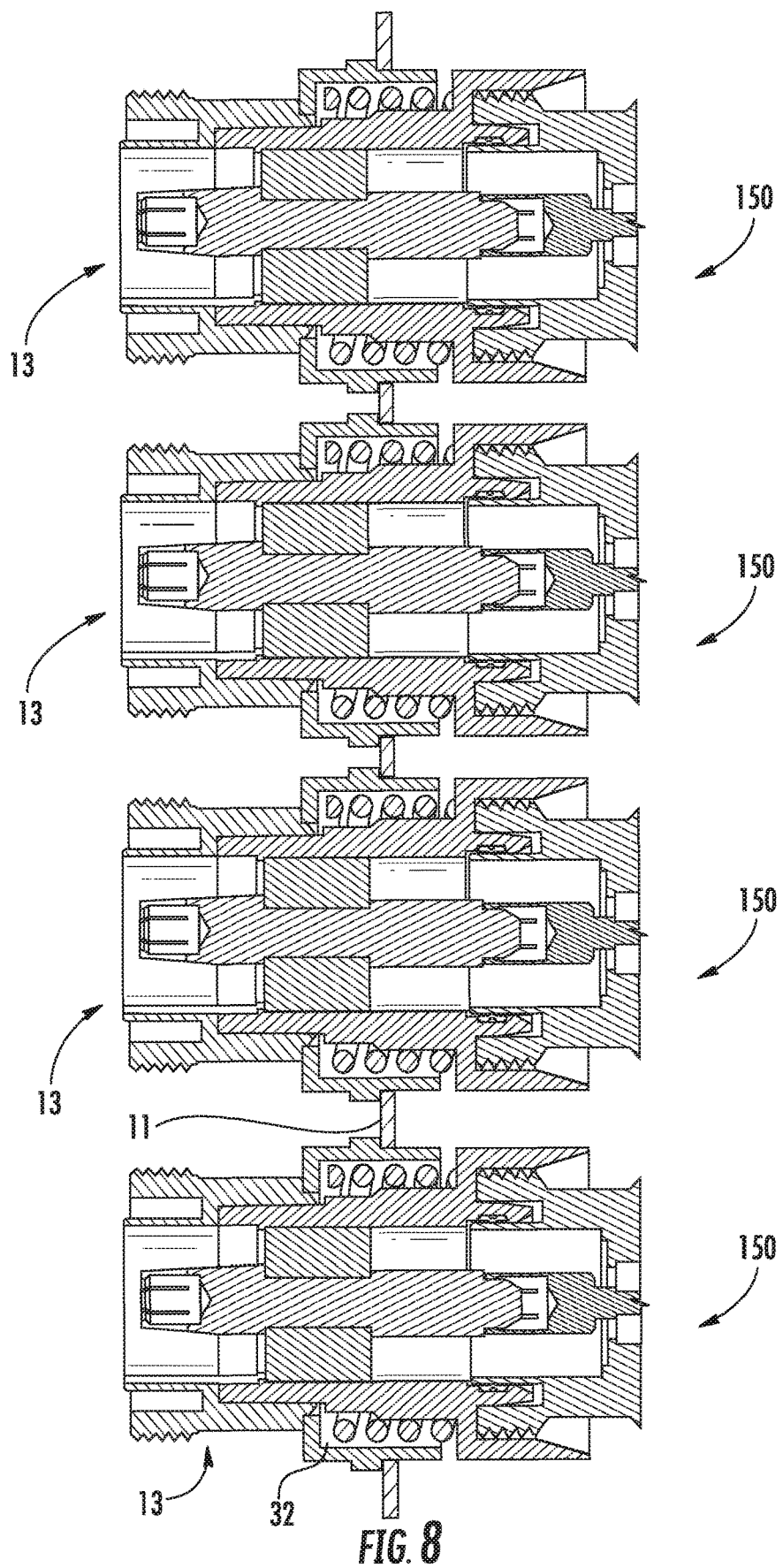
FIG. 8 is a section view of a test fixture with four adapter connectors mating with four ganged DIN connectors according to embodiments of the invention.

Referring now to the figures, a test fixture for testing coaxial connectors for PIM is illustrated in FIGS. 2-4 and designated broadly at 10. The fixture 10 includes a foundation 11 (shown in FIG. 8 in a ganged form) and an adapter connector 13 that is mated with a connector to be tested (such as the connector 150). The adapter connector 13 includes an inner contact 12 similar to that shown above in FIG. 1. The adapter connector 13 also includes an outer body 14 that encircles the inner contact 12 with a gap 16 therebetween. The outer body 14 includes both an inner ring 20 and an outer ring 22 that define a gap 21 that is typically between about 7 and 8 mm in width. The inner ring 20 has a tapered outer surface 20a and a beveled inner edge 20b. A radial recess 24 is present in the inner surface 20c of the inner ring 20. An annular spring ring 26 (FIG. 4) with a concave profile fits within the recess 24. The outer ring 22 has a beveled inner edge 22b. The closed end 27 of the gap 21 forms a stop surface. A shoulder 28 is present on the outer surface of the outer body 14 opposite the closed end 27, with a sloped projection 29 radially inward of the shoulder 28 and extending forwardly therefrom.

The adapter connector 13 also includes a back body 23 that fits over the rear end of the outer body 14. The back body 23 includes a forward shoulder 30.

The foundation 11 of the fixture 10 comprises a sleeve 32 that is fixed to and part of a larger assembly of the foundation 11. The sleeve 32 includes a ring 34 and a radially inward flange 36 at the rearward end of the ring 34. A spring 38 bears on the forward surface of the flange 36 and against the shoulder 28 of the outer ring 22 of the outer body 14. As can be seen in FIG. 2, the flange 36 bears against the shoulder 30 of the back body 23. The interaction between the fixed sleeve 32, the spring 38, the outer body 14 and the back body 23 enable the outer body 14 to adjust its position slightly in the axial and radial directions.

As can be seen in FIG. 2, the adapter connector 13 can be mated with a connector 150 to create an interconnection for PIM testing. Mating is achieved by (a) inserting the inner contact 152 of the connector 150 over the tip of the inner contact 12 and (b) inserting the outer ring 154b of the outer body 154 into the gap 21 and the inner ring 154a radially inward of the inner ring 20 of the outer body 14. The forward end of the outer ring 154b of the outer body 154 "bottoms out" against the closed end 27 of the gap 21. The outer surface of the inner ring 154a of the outer body 154 contacts the spring ring 26, which applies radial pressure to the inner ring 154a and to the inner ring 20 of the outer body 14 of the fixture 10. Once in place in the fixture 10, the connector 150 can be tested for PIM according to conventional procedures.

Notably, the connector 150 is mated and secured in the adapter connector 13 without the need to apply a coupling nut to the connector 150, even though, as is the case with the connector 150, in the field the connector 150 would be mated to a mating connector via a coupling nut. The absence of the coupling nut in the fixture 10 can provide multiple advantages. First, testing can proceed more quickly, as mating and unmating of the connector 150 with the adapter connector 13 requires only a quick axial movement of the connector 150 relative to the adapter connector 13. This advantage is amplified when simultaneously testing multiple connectors 150, such as connectors that are part of a ganged arrangement like that shown in FIG. 8, wherein the fixture includes four adapter connectors 13. Second, the pressure applied by the spring ring 26 on the inner ring 154a of the connector 150 is independent of components other than the adapter connector 13 and the connector 150 themselves. This is in contrast to the fixture 110, in which the magnitude of the torque on the coupling nut 118 impacts the pressure between the connector 150 and the fixture 110, which in turn affects PIM. The pressure applied by the spring ring 26 tends to be consistent from test to test, which in turn can improve the reliability of PIM testing.

In addition, the ability of the outer body 14, the inner contact 12 and the back body 23 of the adapter connector 13 to adjust their positions axially and radially relative to the foundation 11 of the fixture 10 can also facilitate testing set-up. This, again, can significantly simplify the testing of a series of multiple connectors 150 such as ganged connectors. Also, this radial and axial adjustability can facilitate automated PIM testing of connectors, particularly ganged connectors such as those shown in FIG. 8.

Figure 5:
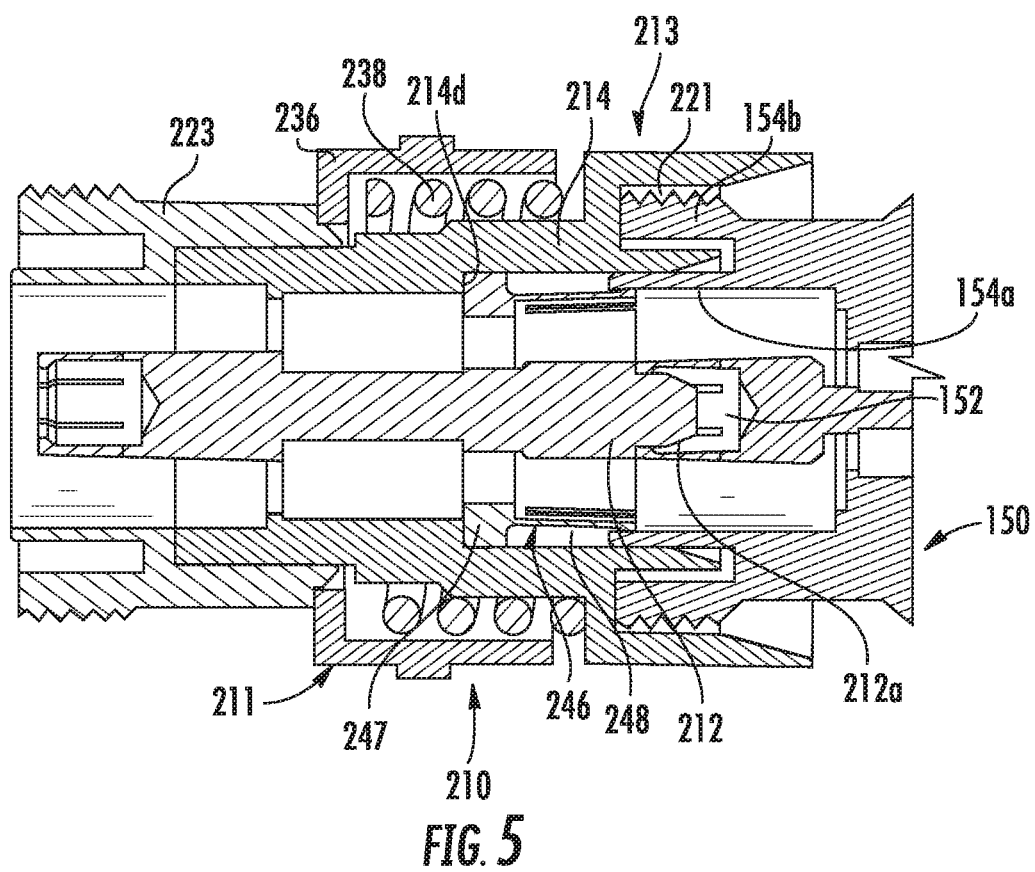
FIG. 5 is a section view of a PIM test fixture and mating DIN connector according to alternative embodiments of the invention.
Figure 6:
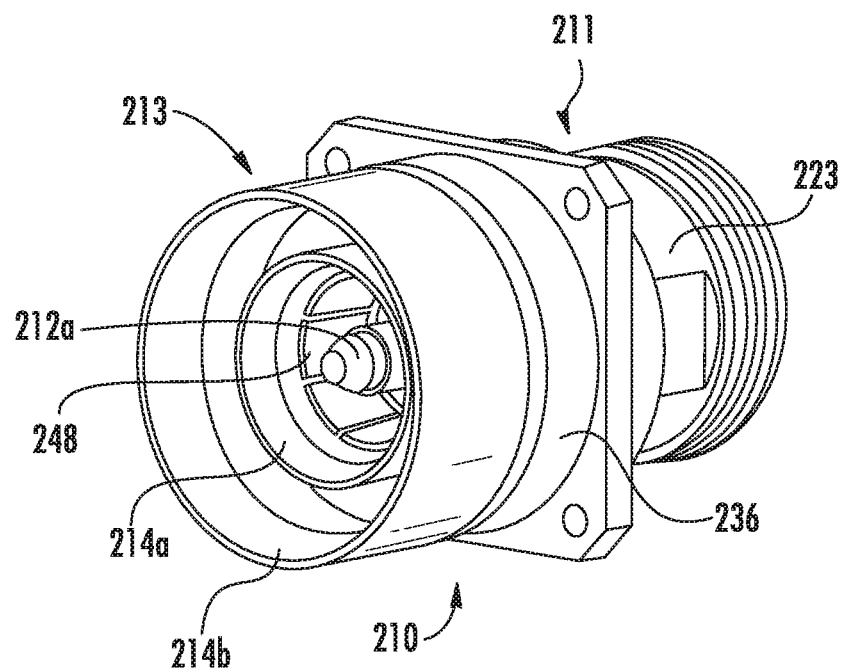
FIG. 6 is a perspective view of the adapter connector of the test fixture of FIG. 5.
Figure 7:
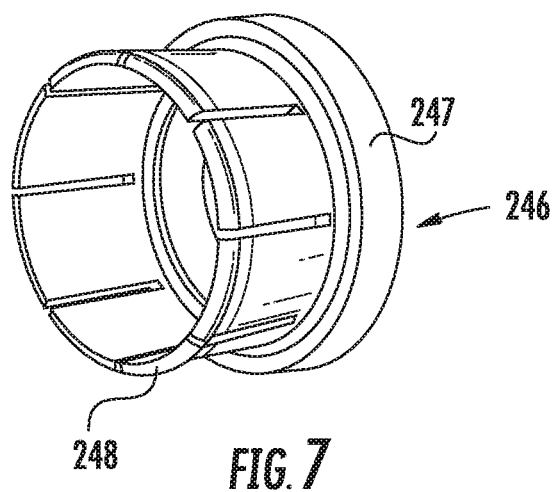
FIG. 7 is a perspective view of the spring basket of the adapter connector of FIG. 5.

Another exemplary fixture is illustrated in FIGS. 5-7 and designated broadly at 210. The fixture 210 is similar to the fixture 10, having an adapter connector 213 with an inner contact 212, an outer body 214, and a back body 223 mounted via a spring 238 to a fixed sleeve 236 of a foundation 211. However, the adapter connector 213 lacks the spring ring that is present in the adapter connector 13, and instead includes a spring basket 246 comprising an annular base 247 and spring fingers 248. The base 247 bears against a shoulder 214*d* in the inner surface of the outer body 214.

As can be seen in FIG. 5, when a connector 150 is mated to the adapter connector 213, the inner contact 152 of the connector 150 mates with the tip 212*a* of the inner contact 212, the outer ring 154*b* of the outer body 154 fits in the gap 221 of the outer body 214, and the inner ring 154*a* of the outer body 154 is radially inward of the inner ring 214*a*. In this embodiment, radial pressure is applied to the inner ring 154*a* via the spring fingers 248 (rather than by a spring ring as discussed above in connection with the fixture 10). This embodiment may enjoy the benefits discussed above, and may also improve the consistency of radial pressure applied to the inner ring 154*a*.

Those of skill in this art will appreciate that, although the spring ring 26 and the spring basket 246 are shown herein, other forms of resilient members may also be employed with the fixtures 10, 210.

Those of skill in this art will also appreciate that, although the fixtures 10, 210 are shown in use with a DIN connector, other varieties of coaxial connectors, such as those meeting the proposed 4.3/10 standard set forth in matter IEC(46F/243/NP) of the International Electrical Commission (an international standards body), may also be tested for PIM with the fixtures 10, 210.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

That which is claimed is:

1. A test fixture for testing a coaxial connector for passive intermodulation (PIM), comprising:
    (a) an adapter connector comprising:
    an inner contact;
    an outer body of the adapter connector that circumferentially surrounds and that is spaced from the inner contact, the outer body including an inner ring and an outer ring with a gap therebetween; and
    a resilient member in electrical contact with the outer body; and
    (b) a foundation including a fixed sleeve and a biasing member, the biasing member exerting an axial force on the sleeve and the outer body of the adapter connector, the biasing member permitting axial and radial adjustment of the outer body and inner contact of the adapter connector relative to the sleeve;
    wherein the gap between the inner and outer rings of the outer body of the adapter connector is configured to receive an outer ring of an outer body of a coaxial connector to be tested;
    wherein the inner ring of the test fixture adapter connector is located to be radially outward of an inner ring of the outer body of the coaxial connector to be tested; and
    wherein the resilient member is positioned to apply radial pressure to the inner ring of the outer body of coaxial connector to be tested.

2. The test fixture defined in claim 1, wherein the resilient member comprises a spring ring located in a recess in the inner ring of the outer body of the adapter connector.

3. The test fixture defined in claim 2, wherein the spring ring is slotted and has an arcuate profile, the spring ring being positioned to deflect and thereby apply radial pressure to the inner ring of the outer body of the adapter connector.

4. The test fixture defined in claim 1, wherein the resilient member comprises a spring basket with a plurality of spring fingers, the spring fingers being positioned to apply radial pressure to an inner surface of the inner ring of the outer body of the coaxial connector to be tested.

5. The test fixture defined in claim 1, wherein the outer ring and inner ring of the outer body of the adapter connector include sloped surfaces to serve as guides for installation.

6. The test fixture defined in claim 1, wherein the biasing member comprises a helical spring.

7. The test fixture defined in claim 1, wherein the gap between the inner ring and the outer ring of the outer body of the adapter connector is between about 7 and 8 mm in width.

8. The test fixture defined in claim 1, wherein the adapter connector is a first adapter connector, the biasing member is a first biasing member, and the fixed sleeve is a first fixed sleeve, and further comprising a second adapter connector mounted in the foundation via a second biasing member and a second fixed sleeve.

9. The test fixture defined in claim 1, in combination with the coaxial connector to be tested, wherein an inner contact of the coaxial connector to be tested is mated with the inner contact of the adapter connector, and wherein the outer body of the coaxial connector to be tested is mated with the outer body of the adapter connector, with the outer ring of the outer body being located in the gap, and the inner ring of the outer body being in radial contact with the resilient member.

10. A method of testing a coaxial connection for passive intermodulation (PIM), comprising the steps of:
    (a) providing the combination defined in claim 9; and
    (b) determining a level of PIM experienced in the combination.

11. The method defined in claim 10, wherein the resilient member comprises a spring ring located in a recess in the inner ring of the outer body of the adapter connector.

12. The method defined in claim 11, wherein the spring ring is slotted and has an arcuate profile, the spring ring being positioned to deflect and thereby apply radial pressure to the inner ring of the outer body of the adapter connector.

13. The method defined in claim 10, wherein the resilient member comprises a spring basket with a plurality of spring fingers, the spring fingers being positioned to apply radial pressure to the inner ring of the outer body of the coaxial connector to be tested.

14. The method defined in claim 10, wherein the outer ring and inner ring of the outer body of the adapter connector include sloped surfaces to serve as guides for installation.

15. The method defined in claim 10, wherein the biasing member comprises a helical spring.

16. The method defined in claim 10, wherein the gap between the inner ring and the outer ring of the outer body of the adapter connector is between about 7 and 8 mm in width.

17. The method defined in claim 10, wherein the adapter connector is a first adapter connector, the biasing member is a first biasing member, and the fixed sleeve is a first fixed sleeve, and further comprising a second adapter connector mounted in the foundation via a second biasing member and a second fixed sleeve, and further comprising and a second coaxial connector to be tested for PIM mated with the second adapter connector.

18. The method defined in claim 17, wherein the first coaxial connector and the second coaxial connector are commonly mounted as ganged connectors.

* * * * *